United States Patent [19]
Watanabe

[11] Patent Number: 5,587,610
[45] Date of Patent: Dec. 24, 1996

[54] SEMICONDUCTOR DEVICE HAVING A CONDUCTIVE LAYER WITH AN APERTURE

[75] Inventor: Masayuki Watanabe, Kanagawa, Japan

[73] Assignee: NEC Corporation, Tokyo, Japan

[21] Appl. No.: 330,093

[22] Filed: Oct. 26, 1994

Related U.S. Application Data

[63] Continuation of Ser. No. 102,260, Aug. 5, 1993, abandoned.

[30] Foreign Application Priority Data

Aug. 6, 1992 [JP] Japan .................................... 4-209903

[51] Int. Cl.$^6$ .......................... H01L 23/48; H01L 23/52
[52] U.S. Cl. .......................... 257/758; 257/48; 257/773; 257/776; 259/310
[58] Field of Search ........................... 257/773, 48, 778, 257/758, 776; 250/310

[56] References Cited

U.S. PATENT DOCUMENTS

| | | | |
|---|---|---|---|
| 4,577,147 | 3/1986 | Frosien et al. | 324/71.3 |
| 4,733,075 | 3/1988 | Sato | 250/310 |
| 5,067,006 | 11/1991 | Shiga | 257/773 |
| 5,145,800 | 9/1992 | Arai et al. | 437/51 |
| 5,194,932 | 3/1993 | Kurisu | 257/773 |

FOREIGN PATENT DOCUMENTS

| | | |
|---|---|---|
| 4075370 | 6/1991 | Japan . |
| 4162546 | 6/1992 | Japan . |

OTHER PUBLICATIONS

Patent Abstracts of Japan, vol. 016, No. 459, 24 Sep. 1992.
Patent Abstracts of Japan, vol. 016, No. 291, 26 Jun. 1992.

*Primary Examiner*—Sara W. Crane
*Assistant Examiner*—David Ostrowski
*Attorney, Agent, or Firm*—Sughrue, Mion, Zinn, Macpeak & Seas

[57] ABSTRACT

A semiconductor device is constituted by a semiconductor substrate of a first conductivity type. An associated circuit element has a first electrode, a second electrode, and an impurity diffusion region of a second conductivity type formed in the semiconductor substrate and connected to the second electrode. An insulating layer is formed to cover the circuit element, and a conductive layer is formed on the insulating layer to cover the circuit element and thereby conceals the first and second electrodes and the impurity diffusion region of the circuit element. An aperture is selectively formed in the conductive layer such that respective parts of the first and second electrodes and the impurity diffusion region are exposed through the aperture, enabling transmission of electrons through the aperture and facilitating testing by an electron beam tester.

7 Claims, 5 Drawing Sheets

SEMICONDUCTOR DEVICE HAVING A CONDUCTIVE LAYER WITH AN APERTURE

This is a Continuation of application No. 08/102,260 filed Aug. 5, 1993, now abandoned.

BACKGROUND OF THE INVENTION

1. Field of the Invention

The present invention relates to a semiconductor device having multi-layer connections.

2. Description of the Related Art

Recently, development of apparatuses used in the evaluation and analysis of semiconductor devices has advanced remarkably. An electron beam tester has been developed to expose an element of a semiconductor device to a beam of electrons, so that the operational state of the element can be evaluated by detecting secondary electrons depending upon the potential at the element. Also, an apparatus has been developed to detect photons due to the current concentration in a local breakdown portion of a MOS transistor, thus detecting such a breakdown portion.

On the other hand, a large number of circuit elements are formed on a semiconductor substrate, and are interconnected with each other by connection layers thereby to carry out desired functions or operations. A multi-level connection structure is commonly used to increase the density of the connection layers. This means, however, that elements are often covered by a connection layer or a conductive layer made of aluminium or the like, and in this case, a beam of electrons are shut off by the conductor layer. Therefore, the beam of electrons cannot reach such elements, and likewise, the generated secondary electrons and photons cannot reach the surface of the device. As a result, it is impossible to effectively operate the above-mentioned evaluation/analysis apparatus for the elements covered by the conductive layer. This will be later explained in detail.

SUMMARY OF THE INVENTION

It is an object of the present invention to provide a semiconductor device having an element covered by a conductor, which can be easily tested by the above-mentioned estimation/analysis apparatuses.

According to the present invention, an aperture is selectively formed in a conductive layer over a semiconductor substrate having an element, with the aperture of the conductor opposing the element.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before describing embodiments of the present invention, a prior art semiconductor device will be explained with reference to FIGS. 1, 2A and 2B.

Figure 1:
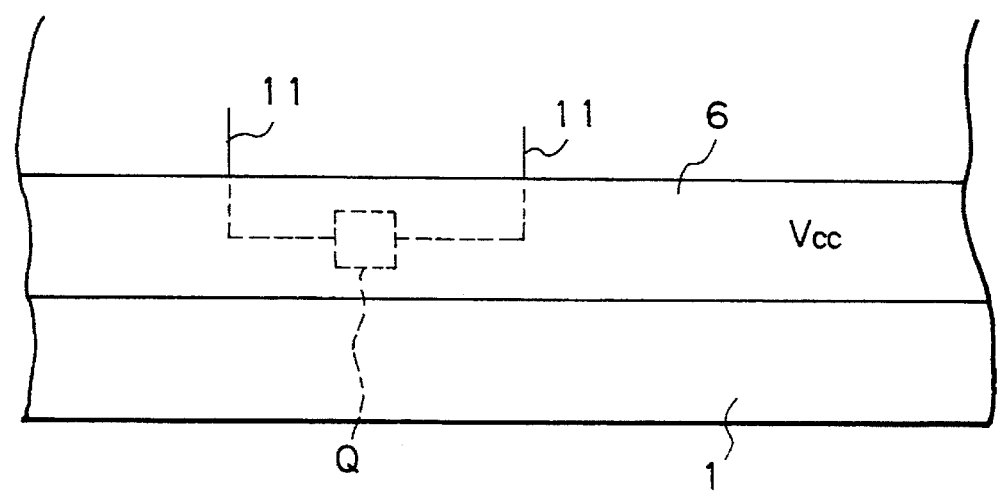
FIG. 1 is a plan view illustrating a part of a prior art semiconductor device.

FIG. 1, which illustrates a prior art semiconductor device, which includes a semiconductor substrate 1 on which a conductive layer 6 for a power supply voltage $V_{cc}$ is formed. The conductive layer 6 is located at the periphery of the semiconductor substrate 1, to apply the voltage $V_{cc}$ to the circuit elements (not shown)formed on the semiconductor substrate 1. Since the conductive layer 6 is wide, some circuit elements such as a MOS transistor Q is formed under the conductive layer 6. In this case, the MOS transistor Q is connected via signal conductive layers 11 to another internal circuit element (not shown).

The proximity of the transistor Q is explained with reference to FIGS. 2A and 2B which are plan and cross-sectional views, respectively. Formed over the semiconductor substrate 1, such as a P-type monocrystalline silicon substrate, is a gate electrode 2 made of polycrystalline silicon. Also, $N^+$-type impurity diffusion regions 3 and 3' serving as source and drain regions are formed in alignment with the gate electrode 2. Further, conductive layers 4 and 4' made of aluminium are connected via contact holes 5 and 5' to the impurity diffusion regions 3 and 3', respectively, and a conductive layer 4" made of aluminium is connected via a contact hole 5" to the gate electrode 2. Thus, the MOS transistor Q of FIG. 1 is obtained. Further, the conductive layer 6, made of aluminium for a power supply voltage such as $V_{cc}$, is formed over the MOS transistor Q with an isolation layer (insulating layer) 20 therebetween, thus reducing the size of a chip area. Note that the width of the conductive layer 6 is about 50 to 100 μm to suppress the voltage drop of the power supply voltage $V_{cc}$ due to the resistance value of the conductive layer 6.

Figure 2A:
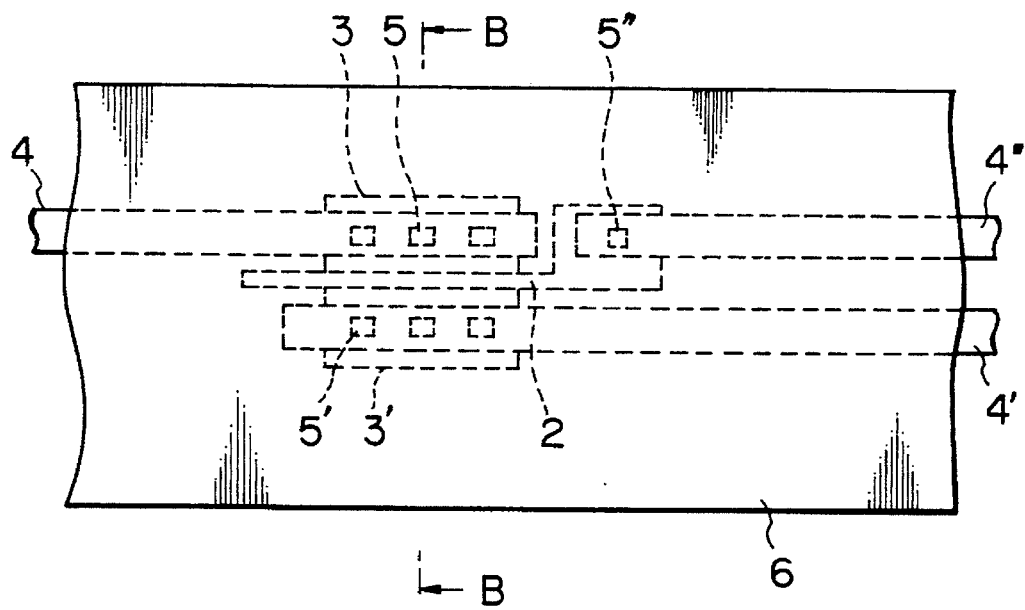
FIG. 2A is an enlarged plan view of the device of FIG. 1.
Figure 2B:
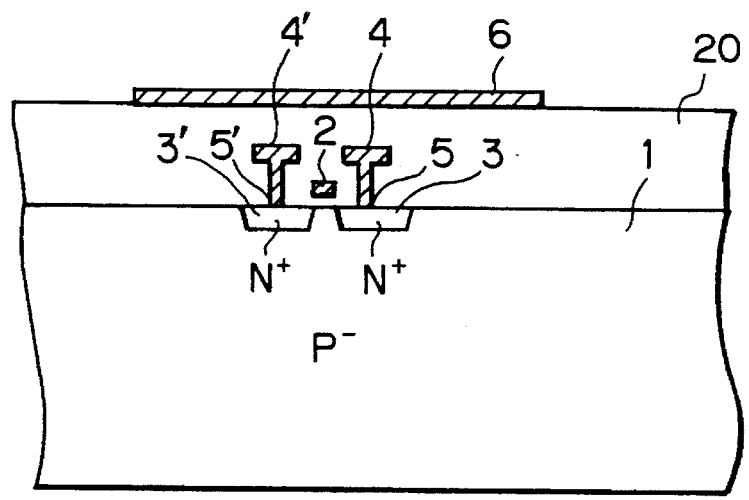
FIG. 2B is a cross-sectional view taken along the line B—B of FIG. 2A.

In the device of FIGS. 2A and 2B, however, as explained above, a beam or electrons being projected toward the MOS transistor Q would be shut off by the conductive layer 6, and accordingly, the beam of electrons could not reach the MOS transistor Q. Likewise, secondary electrons or photons generated from the MOS transistor Q could not reach the surface of the device.

Figure 3:
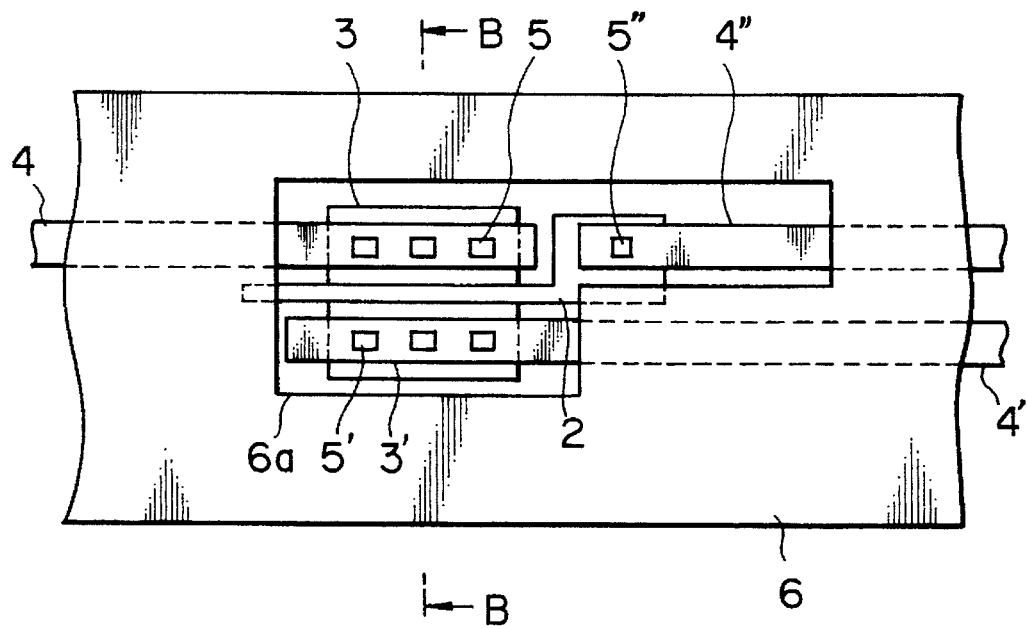
FIG. 3A is a plan view illustrating a first embodiment of the semiconductor device according to the present invention.
FIG. 3B is a cross-sectional view taken along the line B—B of FIG. 3A.
Figure 3:
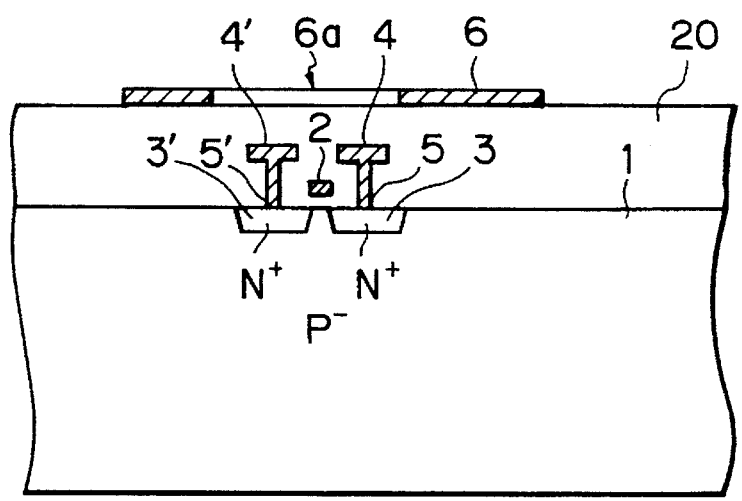

In FIGS. 3A and 3B, which illustrate a first embodiment of the present invention, an aperture 6a is formed in the conductive layer 6. In this case, the aperture 6a opposes the MOS transistor Q, and the shape of the aperture 6a is arranged in parallel with the gate electrode 2. Therefore, even when damage occurs in the gate insulating film (not shown) or the PN junction between the semiconductor substrate 1 and the impurity diffusion regions 3 and 3', such damage can be easily detected by using the above-mentioned evaluation/analysis apparatuses.

Figure 4:
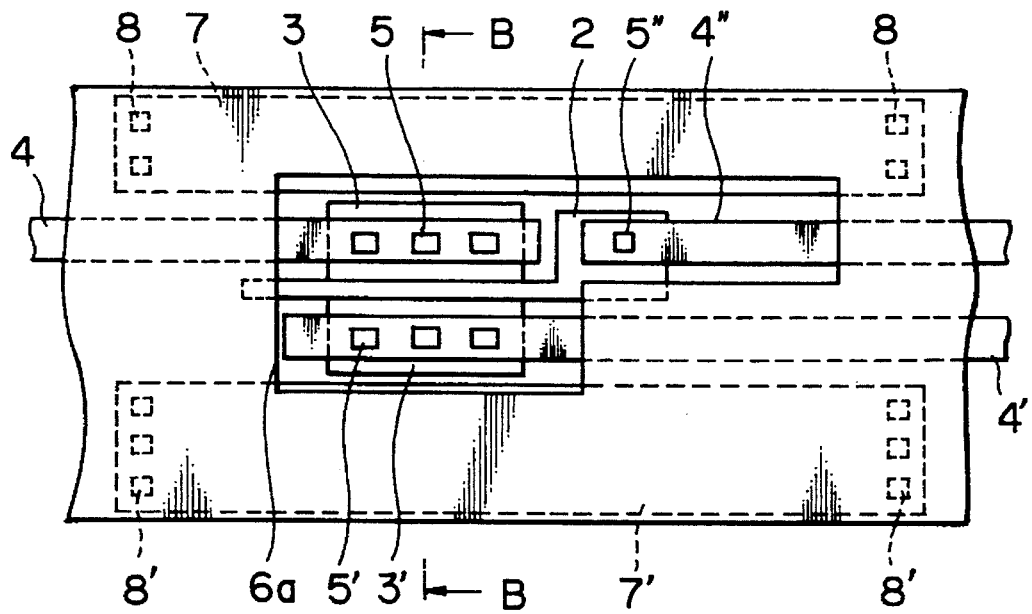
FIG. 4A is a plan view illustrating a second embodiment of the semiconductor device according to the present invention.
FIG. 4B is a cross-sectional view taken along the line B—B of FIG. 4A.
Figure 4:
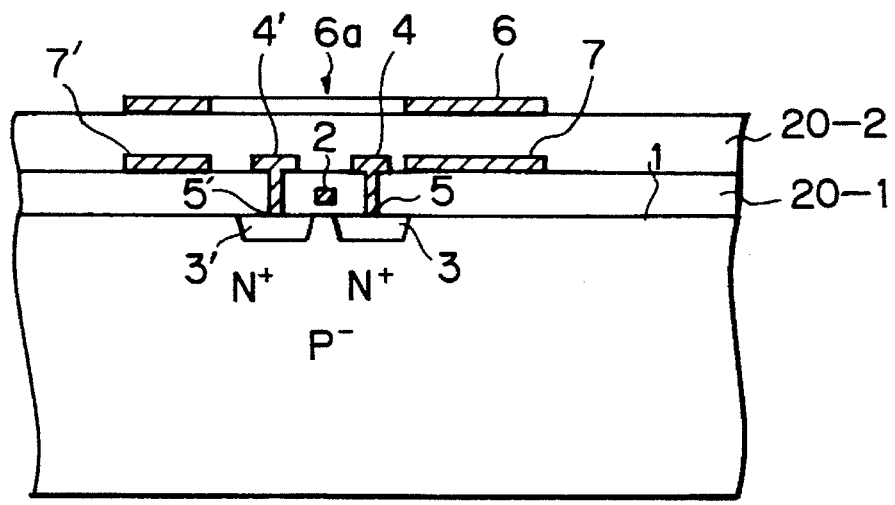

In FIGS. 4A and 4B, which illustrate a second embodiment of the present invention, two conductive layers 7 and 7' are added to the elements of FIGS. 3A and 3B. That is, the conductive layers 7 and 7' are made of aluminium and are manufactured simultaneously with the conductive layers 4 and 4'. The conductive layers 4, 4', 7 and 7' are formed on an insulating layer 20-1 which is formed on the semiconductor substrate 1. On the other hand, the conductive layer 6 having the aperture 6a is formed on an insulating layer 20-2 which is formed on the conductive layers 4, 4', 7 and 7'. The conductive layers 7 and 7' are connected to the conductive layer 6 through via-holes 8 formed in the insulating layer 20-2. Therefore, the conductive layers 7 and 7' suppress the increase in resistance of the conductive layer 6 due to the presence of the aperture 6a, thus stabilizing the operation of the device.

Figure 5A:
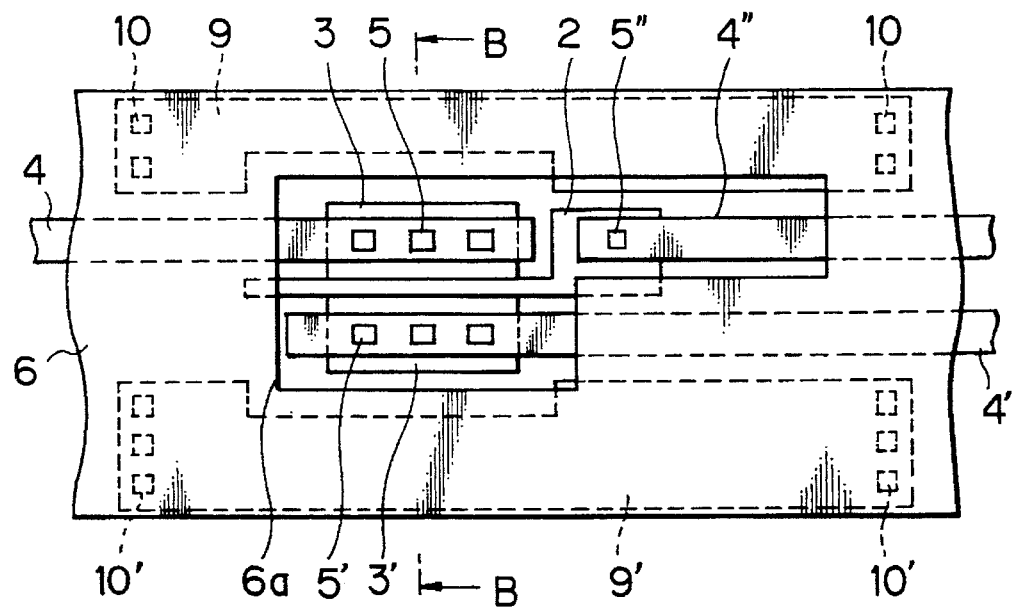
FIG. 5A is a plan view illustrating a third embodiment of the semiconductor device according to the present invention.
Figure 5B:
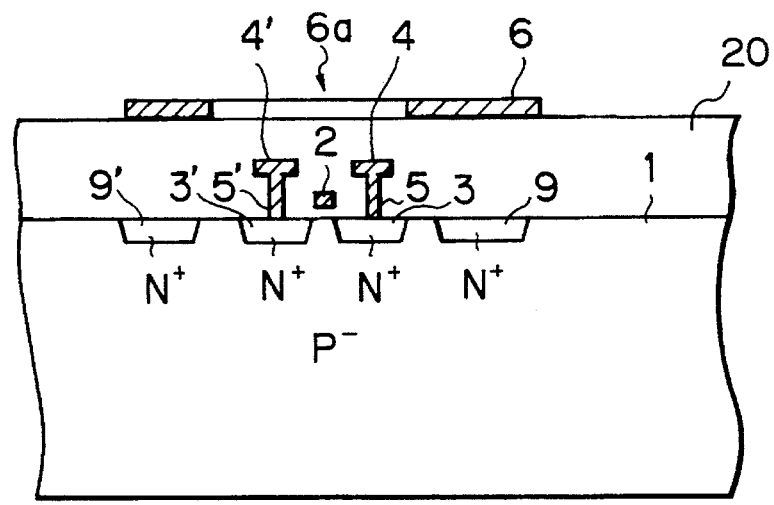
FIGS. 5B is a cross-sectional view taken along the line B—B of FIG. 5A.

In FIGS. 5A and 5B, which illustrate a third embodiment of the present invention, two N$^+$-type impurity diffusion regions 9 and 9' are added to the elements of FIGS. 3A and 3B. That is, the impurity diffusion regions 9 and 9' are manufactured simultaneously with the impurity diffusion regions 3 and 3'. The impurity diffusion regions 9 and 9' are also connected to the conductive layer 6 through via-holes 10 to suppress the increase in resistance or the conductive layer 6 due to the presence of the aperture 6a, thus stabilizing the operation of the device.

As explained hereinbefore, according to the present invention, since an aperture is provided in the conductive layer over an element such as a MOS transistor, evaluation/analysis can be carried out without contact by the above-mentioned evaluation/analysis apparatuses.

I claim:

1. A semiconductor device comprising:

a semiconductor substrate of a first conductivity type;

a circuit element having a first electrode, a second electrode, and an impurity diffusion region of a second conductivity type formed in said semiconductor substrate and connected to said second electrode, and said first electrode is formed over said semiconductor substrate;

an insulating layer formed to cover said circuit element; and a conductive layer formed on said insulating layer over said circuit element, an aperture being selectively formed in said conductive layer such that respective parts of said first and second electrodes and said impurity diffusion region are exposed through said aperture such that electrical continuity of said conductive layer is retained.

2. The device as claimed in claim 1, wherein said circuit element is an insulated gate field effect transistor and said first electrode is a gate electrode of said insulated gate field effect transistor.

3. A semiconductor device comprising:

a semiconductor substrate; a circuit element formed in said semiconductor substrate;

an insulating film formed on said semiconductor substrate to cover said circuit element;

a first conductive layer formed on said insulating film over said circuit element, an aperture being selectively formed in said first conductive layer to form in said first conductive layer an opening through which at least one part of said circuit element is observed, said first conductive layer thereby having a portion whose width is made narrow by said aperture, such that electrical continuity of said first conductive layer is retained; and a second conductive layer formed along and connected in parallel to said portion of said first conductive layer so as to lower a resistance of said portion of said first conductive layer.

4. The device as claimed in claim 3, wherein said second conductive layer is formed to overlap said first portion of said first conductive layer.

5. The device as claimed in claim 4, wherein said second conductive layer comprises a conductor buried in said insulating film, said conductor having first and second end parts, each connected through a via-hole formed in said insulating film to said first conductive layer, such that said conductor is connected in parallel to said portion of said first conductive layer.

6. The device as claimed in claim 4, wherein said second conductive layer comprises an impurity diffusion region selectively formed in said semiconductor substrate, said impurity diffusion region having first and second end parts, each connected through a via-hole formed in said insulating film to said first conductive layer, such that said impurity region is connected in parallel to said portion of said first conductive layer.

7. A semiconductor device comprising:

a semiconductor substrate;

a circuit element selectively formed in said semiconductor substrate;

an insulating film formed on said semiconductor substrate to cover said circuit element; and a metal layer formed on said insulating film to cover said circuit element, an aperture being selectively formed in said metal layer such that electrical continuity of said metal layer is retained, said aperture being formed to make in said metal layer a hole so as to enable transmission of electrons between an evaluation/analysis apparatus and said circuit element.

* * * * *